United States Patent [19]

Sugiura et al.

[11] Patent Number: 4,604,580
[45] Date of Patent: Aug. 5, 1986

[54] NUCLEAR MAGNETIC RESONANCE DIAGNOSTIC APPARATUS

[75] Inventors: Satoshi Sugiura, Nishi-Nasuno; Mitchio Mitomi, Otawara; Hirokazu Suzuki, Tokyo, all of Japan

[73] Assignee: Tokyo Shibaura Denki Kabushiki Kaisha, Japan

[21] Appl. No.: 587,974

[22] Filed: Mar. 9, 1984

[30] Foreign Application Priority Data

Mar. 11, 1983 [JP] Japan .................................. 58-40377

[51] Int. Cl.⁴ ............................................ G01R 33/20
[52] U.S. Cl. .................................... 324/311; 324/312; 324/314
[58] Field of Search ............... 324/300, 307, 311, 309, 324/314, 312, 313

[56] References Cited

U.S. PATENT DOCUMENTS

| | | | |
|---|---|---|---|
| 2,968,762 | 1/1961 | Schuster | 324/314 |
| 3,110,858 | 11/1963 | Arnold | 324/311 |
| 3,124,741 | 3/1964 | Primas | 324/314 |
| 3,711,764 | 1/1973 | Ernst | 324/312 |
| 3,781,650 | 12/1973 | Keller | 324/311 |

*Primary Examiner*—Michael J. Tokar
*Attorney, Agent, or Firm*—Finnegan, Henderson, Farabow, Garrett & Dunner

[57] ABSTRACT

Apparatus is provided in an NMR diagnostic apparatus for reducing or eliminating low frequency cyclic noise. The NMR signals are phase demodulated using reference signals having the same frequency as the excitation signals. A provision is made to change the phases of the output reference signals by 180°. These signals are selectively used to demodulate the received NMR signals which are first divided into two signals of the same phase. The demodulated signals, which are 180° apart, are added thereby eliminating the cyclic noise component.

6 Claims, 8 Drawing Figures

NUCLEAR MAGNETIC RESONANCE DIAGNOSTIC APPARATUS

FIELD OF THE INVENTION

This invention relates to signals associated with nuclear magnetic resonance diagnospecific atomic nuclei which are existent in an object, such as a human being, and the utilization of the nuclear magnetic resonance phenomena for the collection of those signals.

BACKGROUND OF THE INVENTION

In nuclear magnetic resonance (NMR) diagnostic apparatus, NMR signals are amplified and divided for performing quadrature detection with one phase component as a reference (real part) and the other phase component shifted by a phase of 90° (imaginary part). These two signals are amplified again, analog-to-digital (A/D) converted after passing a low-pass filter, and applied to a computer in which complex Fourier transformation is performed for image reconstruction.

In the above case, if low frequency noise such as an A.C. hum is mixed on top of the NMR signal, artifacts appear at the central portion of the reconstruction image when performing image reconstruction.

We now will explain the problem described above in more detail exemplifying the concrete constuction of the conventional apparatus.

In FIG. 1, the NMR signals 5 are divided and applied to phase demodulators 1A and 1B, respectively, which phase demodulates them with reference signals r(0) and r(90) that differ in phase by 90°. Demodulated signals x and y are outputted respectively from demodulators 1A and 1B. The reference signals r(0) and r(90) are generated from a 90° phase shifter 3 responsive to the output from reference oscillator 2 which is commonly employed with the circuit for generating the excitation pulses, their frequency being the same as the excitation signal. The signals x and y are respectively applied to analog-to-digital (A/D) converters 6A and 6B through amplifiers 4A and 4B, and low-pass filters 5A and 5B. The outputs of A/D converters 6A and 6B are applied to a computer 7.

Assuming $\alpha$ is the gain for the signal system comprising the amplifier 4A, low-pass filter 5A and A/D converter 6A, and $\beta$ is the gain for the signal system comprising the amplifier 4B, low-pass filter 5B and A/D converter 6B, the output signals of A/D converters 6A and 6B would be represented by $\alpha x$ and $\beta y$, respectively. After substituting $\alpha x$ and $\beta y$ as the real part and imaginary part of the signal, that signal is complex Fourier transformed in the computer 7 to obtain data in the frequency domain.

In such an apparatus if cyclic low frequency noise such as hum caused by the A.C. supply are mixed in the signal prior to phase demodulation ring-shaped artifacts appear at the central portion of the image when performing image reconstruction after complex Fourier transformation.

However, it is difficult to completely prevent the mixture of such A.C. supply hum. It is not possible to eliminate low frequency noise by filtering means such as the low pass filters 5A and 5B since they must pass the frequency band of the demodulation output signals. Accordingly, the above-mentioned artifacts die to noise prevent improvement in image quality in the NMR diagnostic apparatus.

SUMMARY OF THE INVENTION

It is therefore an object of this invention to provide NMR diagnostic apparatus for performing demodulation of NMR signals by phase demodulation wherein low frequency cyclic noise mixed after demodulation reduces or eliminates the noise effectively.

Briefly, this and other objects are achieved in accordance with a first aspect of the invention by NMR diagnostic apparatus which obtains the spin density, the relaxation time constant, or the data relative thereto of specific atomic nuclei within an object, for image formation by utilizing signals induced by NMR phenomena. The apparatus comprises means for generating high frequency pulses to be applied to the object for excitation of nuclear magnetic resonance synchronized with a cyclic noise component induced from the signal receiving system, transmission and reception means for respectively applying the high frequency pulses into the object and detecting the NMR signals evoked from the object, means for phase demodulating the NMR signals received by the transmission and reception means, means for generating reference signals having the same frequency as the excitation signals which are synchronously applied to the phase demodulation means as reference signals for phase demodulation, means for changing the phases of the output reference signals from the reference signal generating means by 180°, means for performing phase change control of the reference signals applied to the phase demodulation means by controlling the phase change means, means for phase inverting by 180° one of the demodulated outputs and addition means for adding corresponding outputs which differ in phase by 180° to eliminate the cyclic noise component.

DESCRIPTION OF THE PREFERRED EMBODIMENT

Figure 1:
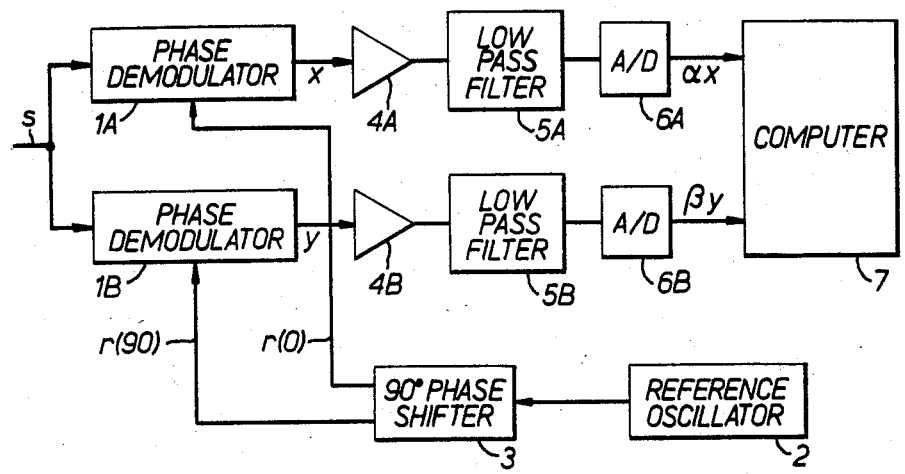
FIG. 1 is a schematic block diagram illustrating the principal construction of an example of a conventional apparatus.

We will now explain a first embodiment of this invention by referring to the drawings.

Figure 2:
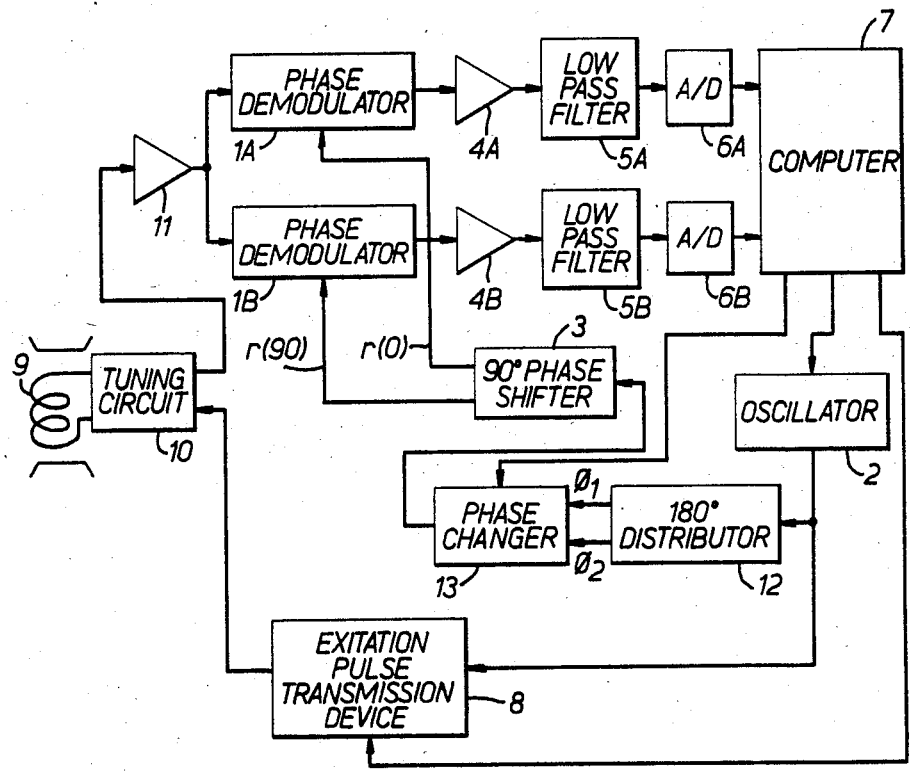
FIG. 2 is a schematic block diagram illustrating the construction of a preferred embodiment of this invention.

In FIG. 2 the same reference symbols are affixed to the same components as like components of FIG. 1. In the drawing, the frequency of the reference oscillator 2 is controlled by the computer 7 and an output of reference oscillator 2 is transmitted to an excitation pulse transmission device 8. This excitation pulse transmission device 8 operates to generate high frequency excitation pulses by, for example, amplitude modulating the high frequency output from the reference oscillator 2 and supplying excitation pulses to a probe-head after amplification.

The generation of the excitation pulse signal in the excitation pulse transmission device 8 is synchronized with the low frequency noise components which are mixed into the receiving system after demodulation, for example, in the present embodiment by control using the computer 7. The probe-head is provided with a transmission and reception coil 9, as well as tuning circuit 10, and the high frequency excitation pulses issued from the excitation pulse transmission device 8 are transmitted from the transmission and reception coil 9 through the tuning circuit 10. The NMR signals which are induced within an object by excitation with those high frequency excitation pulses, are received and detected by the same probe-head.

The NMR signals are demodulated by the phase demodulators 1A and 1B, respectively, after amplification by amplifier 11. The demodulated signals are amplified by amplifiers 4A and 4B, respectively, and converted to digital form by the A/D converters 6A and 6B after passing through the low pass filters 5A and 5B to be delivered to the computer 7.

A 180° distributor 12 performs phase conversion of the output from the reference oscillator to generate two reference oscillating outputs $\phi_1$ and $\phi_2$ which differ in phase from each other by 180°. These outputs $\phi_1$ and $\phi_2$ are delivered to phase changer 13 which selects one of the signals $\phi_1$ or $\phi_2$ to apply to a 90° phase shifter 3, based on control signals of the computer 7. Changer 13 can be constructed with an analog switch to alternately transmit the $\phi_1$ and $\phi_2$ signals responsive to computer 7. The 90° phase shifter 3 issues a first signal, which is of the same phase as the input signal selected $\phi_1$ or $\phi_2$, and a second signal having a 90° phase difference. These reference signals are r(0) and r(90), respectively. The two signals r(0) and r(90), which differ by 90° in phase, are supplied respectively to the phase demodulators 1A and 1B as reference waves for quadrature detection. Accordingly, two different reference signals can be supplied to each phase demodulator 1A and 1B. When signal $\phi_1$ is selected by the exchanger 13 the signals are $r(0)_1$ and $r(90)_1$, and when signal $\phi_2$ is selected, the reference signals are $r(0)_2$ and $r(90)_2$.

Figure 3:
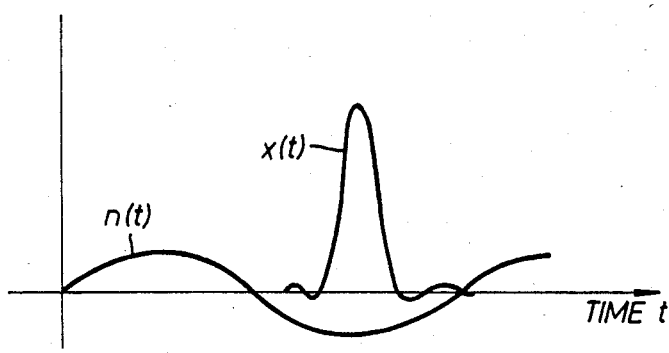
FIGS. 3 to 5 are waveforms for explaining the operation of the embodiment of FIG. 2.

In the above-mentioned embodiment, there now is assumed to be low frequency cyclic noise such as hum due to the A.C. supply which is mixed into the signal system after phase demodulation. The relationship between the NMR signal x(t) and the low frequency noise n(t) is illustrated in FIG. 3. (The low frequency noise n(t) is shown for convenience of explanation as being relatively high compared to the x(t) signal.)

The principle used for canceling such low frequency noise n(t) will be explained in detail as follows. The low frequency cyclical noise is to be canceled, and therefore high frequency pulses are synchronized with the A.C. supply. This procedure is performed, for example, by controlling the excitation pulse transmission device 8 by computer 7. Noise components are detected and high frequency excitation pulses are synchronized with that noise supply source. As a result, after applying the excitation pulses, the above low frequency noise always appears in the same phase of the NMR signal.

For example, if the $\phi_1$ signal of the two outputs $\phi_1$ and $\phi_2$ from the 180° distributor 12 is selected and applied to the phase changer 13, the reference signals $r(0)_1$ and $r(90)_1$ in accordance with signal $\phi_1$ are delivered to the phase demodulators 1A and 1B. The situation at this time is illustrated in FIG. 3, and the composite signal of the NMR signal x(t) and the noise signal n(t) is shown in FIG. 3.

Figure 4:
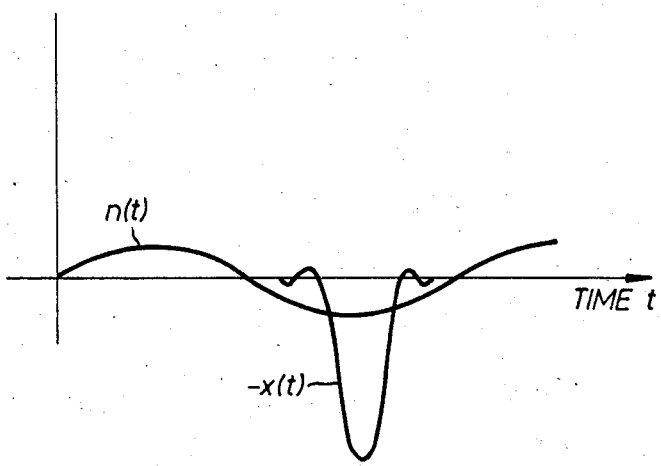

Next, the measurement of NMR signals is performed selecting the output $\phi_2$ of the 180° distributor 12 and applying it to the phase changer 13. This signal $\phi_2$ differs 180° in phase from the first signal $\phi_1$ described above so that the reference signals applied to phse demodulators 1A and 1B are $r(0)_2$ and $r(90)_2$. The NMR signals are demodulated with the reference signals of a phase differing 180° from the first one, namely, the inverse phase. That is, the demodulated NMR signals as shown in FIG. 4 are −x(t) and are of inverse phase to those shown in FIG. 3. Accordingly, the low frequency noise components of constant cycle which are induced in the signal system are brought into the same phase with the NMR signals as the first time. Namely, the phase polarity of only the demodulated NMR signals is reversed and the phase polarity of the low frequency noise remains the same.

Figure 5:
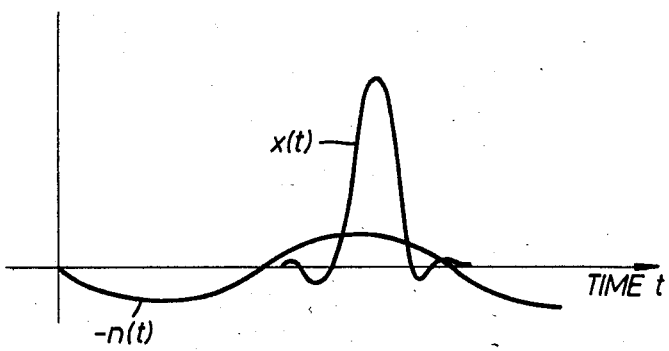

In the next operation, for example, the digital representation of the signals −x(t) and n(t) in FIG. 4, are multiplied by −1 within the computer 7 to reverse in essence the phase polarity. As a result, the composite waves of the signals x(t) and −n(t) are as shown in FIG. 5, and they are digitally added to the first signals (i.e., FIG. 3) in the computer 7. By this procedure the signals of FIG. 3 and the signals of FIG. 5, in digital form, are added. Therefore, the NMR signal components are represented by $x(t)+x(t)=2x(t)$, namely, two times the signal of each measuring time. The cyclic noise components of low frequency are offset according to the formula $n(t)-n(t)=0$.

To further improve the signal to noise ratio (S/N), the signal collection is frequently repeated a plurality of times under the same condition to add all of the collected signals. Thereupon, the measurement due to demodulation of the signal $\phi_1$ and the measurement due to demodulation of the signal $\phi_2$ are performed the same number of times, respectively. Namely the same number of the two kinds of the collected NMR signals corresponding to the signals $\phi_1$ and $\phi_2$ are obtained by performing the NMR signal collection a number of times. Each of the obtained NMR signals of one kind are summed and added to the sum of the inverted signals.

Consequently, the low frequency periodic noise components which are carried in the signal system after demodulation are effectively suppressed. Also, since not only the low frequency noise components but also any D.C. components contained in the signal system cancel each other, an added benefit is achieved. If undesirable D.C. offset components exist, for example, in the amplifiers 4A and 4B, they will be offset and cancelled.

It will be apparent, to those skilled in the art, that modifications and variations can be made in the preferred embodiment disclosed herein without departing from the scope or the spirit of the invention.

Figure 6:
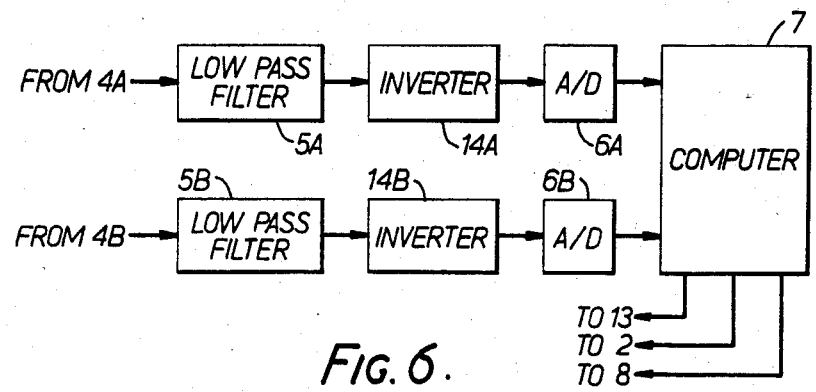
FIGS. 6 to 8 are schematic block diagrams illustrating the constructions of other embodiments of the invention.
Figure 7:
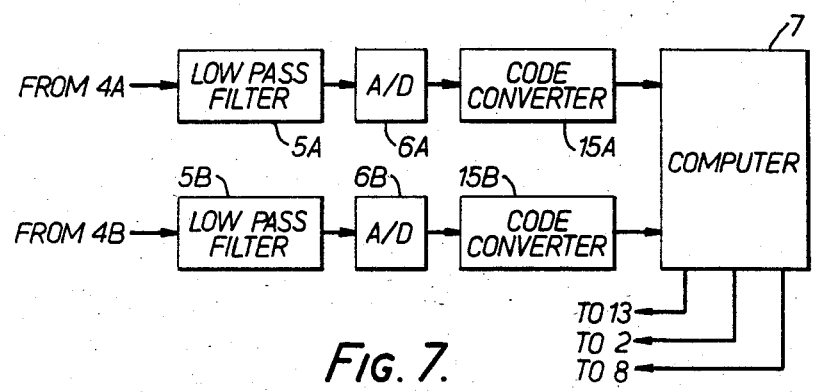
Figure 8:
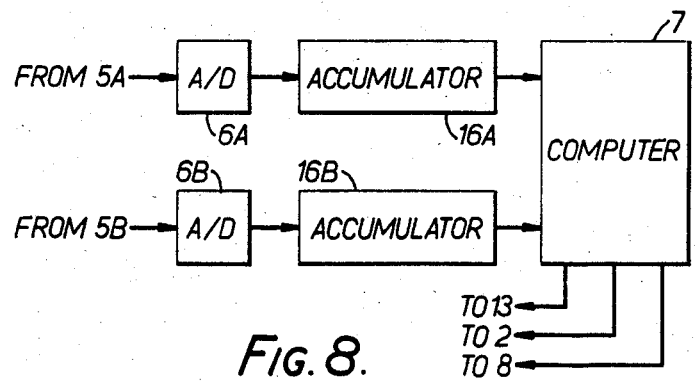

For example, in the above-mentioned embodiment, either one of the two kinds of reference waves which differ 180° in phase from each other can be selected to apply to the demodulators. Then the inverse demodulation signal is added with the other signal. This has been described as being performed digitally in the computer 7 by addition after multiplying by −1. However, that procedure may be realized by certain hardware before inputting into the computer 7. That is, the phase polarity inversion may be performed by inserting inverters 14A and 14B before A/D converters 6A and 6B as shown in FIG. 6 or by inserting code converters 15A and 15B for mark inversion after A/D converters 6A and 6B as shown in FIG. 7. Also, the addition step may be realized by inserting accumulators 16A and 16B before the computer 7 as shown in FIG. 8. Furthermore, the phase inversion may be performed anywhere and by any means providing it is done after demodulation and noise mixture. The addition step may be performed anywhere and by any means provided it is after phase inversion.

Moreover, in the above description, it has been explained that the high frequency excitation pulses are generated to synchronize with the noise components. However, if the frequencies of the noise components have been previously determined, the measurement of NMR signals may be performed while gradually altering the timing of the excitation pulses, thereby searching for the timing where noise is at a minimum. By such means, it is possible to synchronize the excitation pulses with the noise components without directly detecting the noise components.

Still further, without being limited to quadrature detection, this invention can be applied to any system which performs phase demodulation (synchronous demodulation), such as a normal phase demodulation.

What is claimed is:

1. In nuclear magnetic resonance diagnostic apparatus for image formation, which receives signals induced by nuclear magnetic resonance phenomena, the apparatus comprising:
    means for generating high frequency pulses to be applied to the object for excitation of nuclear magnetic resonance synchronized with a cyclic noise component in the signal receiving system;
    means for applying said high frequency pulses to the object and detecting the nuclear magnetic resonance signals evoked from the object;
    means for phase demodulating the nuclear magnetic resonance signals received by said transmission and reception means;
    means for generating reference signals having the same frequency as said excitation signals and synchronized therewith to supply reference signals for phase demodulation to said phase demodulation means;
    means for changing the phase of a first output reference signal from said reference signal generating means to a second signal 180° different in phase;
    means for performing phase change control of said first and second output reference signals applied to said phase demodulation means;
    means for phase inverting selectively the demodulated outputs obtained by said phase demodulation means by selectively applying to said phase modulating means said two reference signals which differ 180° in phase from each other; and
    means for adding corresponding pairs of inverted and noninverted signals of the demodulated outputs for eliminating the cyclic noise component.

2. The nuclear magnetic resonance diagnostic apparatus of claim 1 wherein said phase inversion means is a computer which operates on the demodulated outputs of the demodulation means.

3. The nuclear magnetic resonance diagnostic apparatus of claim 1 wherein said phase inversion means are inverters.

4. The nuclear magnetic resonance diagnostic apparatus of claim 1 wherein said phase inversion means are code converters responsive to the output of said phase demodulation means where said phase demodulation means includes means for converting the demodulated outputs to digital form.

5. The nuclear magnetic resonance diagnostic apparatus of claim 1 wherein said addition means is a computer.

6. The nuclear magnetic resonance diagnostic apparatus of claim 1 wherein said addition means is accumulators responsive to the output of said phase demodulation means where said phase demodulation means includes means for converting the demodulated outputs to digital form.

* * * * *